May 7, 1957 JACQUES I. PANTCHECHNIKOFF 2,791,703
NOW BY CHANGE OF NAME
JACQUES ISAAC PANKOVE
SEMI-CONDUCTOR DEVICES HAVING FOCUSING ELECTRODES
Filed May 1, 1951

INVENTOR
JACQUES I. PANTCHECHNIKOFF
BY H. L. Newton
ATTORNEY

United States Patent Office 2,791,703
Patented May 7, 1957

2,791,703

SEMI-CONDUCTOR DEVICES HAVING FOCUSING ELECTRODES

Jacques I. Pantchechnikoff, now by change of name Jacques Isaac Pankove, Princeton, N. J., assignor to Radio Corporation of America, a corporation of Delaware Application May 1, 1951, Serial No. 223,905

7 Claims. (Cl. 307—88.5)

Figure 1:
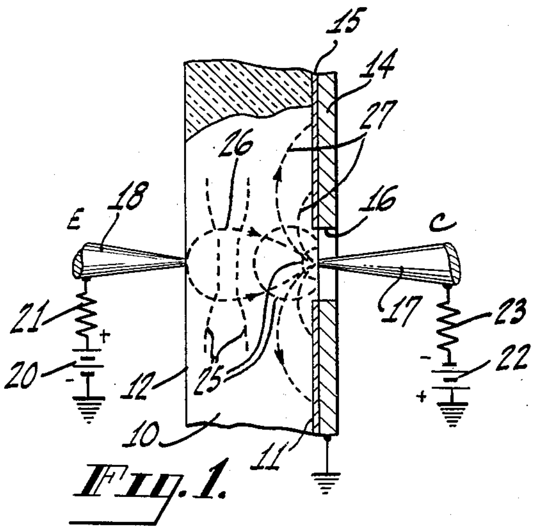

This invention relates generally to semi-conductor devices, and particularly relates to transistors having improved electrode configurations.

A transistor is a semi-conductor device having a semiconducting body such as a crystal of silicon or germanium provided with three electrodes. One of the electrodes is in low-resistance contact with the crystal and is called the base electrode. The other two electrodes are in rectifying contact with the crystal and are called the emitter and the collector electrodes. A potential in the forward direction is impressed between emitter and base and a potential in the reverse direction is applied between collector and base. Such a transistor may be used, as is well known, in amplifier, modulator, oscillator or the like circuits.

During operation of a transistor, both the emitter and the collector electrodes inject charge carriers of opposite polarity into the crystal. If the crystal consists of an N type material, the emitter will be biased positively and the collector negatively with respect to the base. Under these conditions the emitter injects holes into the crystal which have a positive charge, while the collector injects electrons into the crystal. The holes behave somewhat like electrons having a positive charge.

The operation of a transistor is dependent to a large extent on the transit time of the holes and on their recombination. The transit time should be as short as possible to permit high frequency operation. The recombination of the holes with electrons should be as small as possible. It will, of course, be obvious that the recombination is proportional to the path length of the holes. It has further been found that recombination takes place faster at the surface of the crystal than in the interior. Furthermore, for efficient operation the barrier layer which is formed within the crystal or at its surface should be as thin as possible. It has been found that the thickness of the barrier layer decreases as the potential gradients within the crystal increase.

In accordance with the present invention, the electrodes of a transistor are disposed in accordance with the principles of electron optics to obtain optimum conditions for its performance. In this manner the gain as well as the efficiency of the transistor may be increased and the output impedance reduced. The conventional transistor has an input impedace of the order of 200 ohms and an output impedance of the order of 10,000 ohms. In view of the large difference between the input and output impedances of the transistor, matching of successive amplifier stages connected in cascade presents appreciable problems to the circuit designer. Therefore, a smaller ratio of output impedance to input impedance would be desirable.

It is therefore an object of the present invention to provide a transistor having electrodes of such a configuration that the gain is increased and that the required emitter current as well as the output impedance are reduced.

Another object of the invention is to provide an improved transistor having a ratio of output impedance to input impedance which is considerably reduced, thereby to facilitate matching of successive transistor amplifier stages.

A further object of the invention is to provide a transistor wherein the electrodes are so disposed that the charge carriers injected by the emitter are substantially focused onto the collector while the charge carriers injected by the collector are substantially collected by the base.

In accordance with the present invention the transistor comprises a semi-conducting body or crystal having a first substantially plane surface and a second surface which may also be plane and which is disposed opposite the first surface. The base electrode is in low-resistance contact with substantially the entire area of the first plane surface with the exception of a small surface portion within which the collector is disposed. The emitter electrode is in contact with the second surface substantially opposite the collector. When a voltage in the forward direction is applied between emitter and base and a voltage in the reverse direction between collector and base, the charge carriers injected into the crystal by the emitter are substantially focused upon the collector. On the other hand, the charge carriers injected into the crystal by the collector are defocused and, accordingly, the majority of these charge carriers is collected by the base. A transistor in accordance with the invention will have an improved gain and a lower emitter current, that is, an improved efficiency. This is, of course, due to the fact that substantially all charge carriers injected by the emitter are collected by the collector. Furthermore, the collector impedance or the ratio of the collector impedance to the emitter impedance is reduced.

Figure 2:
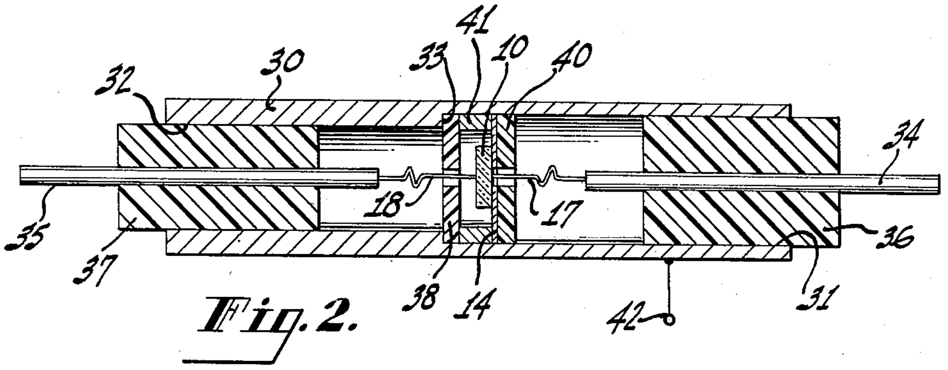

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a sectional view illustrating schematically a transistor embodying the present invention; and Figure 2 is a sectional view of a preferred embodiment of the transistor of the invention.

Referring now to the drawing wherein like components are designated by the same reference characters and particularly to Figure 1 there is illustrated a transistor having a semi-conducting body 10. Body 10 may consist of a crystal of silicon or preferably of germanium. The crystal may be of the P type or of the N type, but for the following discussion it will be assumed that it consists of the N type. The body 10 is provided with a first substantially plane surface 11 and with a second surface 12 disposed opposite the first surface 11. Surface 12 may also be substantially plane as illustrated. However, it is to be understood that surface 12 may also have concave shape and may, for example, consist of a spherical depression. Transistors having two faces with ground spherical depressions are well known. They are called coaxial transistors and have been described, for example, by J. N. Shive in "Physical Review," vol 75, 1949, p. 689, and by W. E. Kock and R. L. Wallace, Jr., in "Electrical Engineering," March 1949, pp. 222–223 (see also Patent 2,522,521 to Kock).

A metallic sheet or foil 14 is soldered as indicated at 15 to the first plane surface 11 of the crystal 10. The sheet or foil 14 is provided with a central aperture indicated at 16 so that a predetermined small surface portion of the crystal is not covered by the foil 14. A fine pointed wire indicated at 17 is in contact with the surface 11 of crystal 10 and is disposed within the central aperture 16 of foil 14. A second pointed wire 18 is in contact with the second surface 12 of the crystal 10 and is preferably disposed opposite the wire 17.

Foil 14 is in low-resistance contact with crystal 10. Both wires 17 and 18 are in rectifying contact with the crystal 10. Foil 14 is adapted for use as a base electrode, while wires 17 and 18 are adapted respectively for use as collector and emitter electrodes. For operation in an amplifier or the like circuit the electrodes must be energized by applying a voltage in the forward direction between emitter 18 and base 14 and by impressing a voltage in the reverse direction between collector 17 and base 14. If body 10 is of the N type as previously assumed, the emitter 18 should be positive and the collector 17 negative with respect to the base 14. If the crystal should be of the P type, the polarities must be reversed.

Accordingly, base electrode 14 may be grounded as indicated. A battery 20 has its negative terminal grounded while its positive terminal is connected to the emitter 18 through a suitable impedance such as resistor 21. Battery 22 has its positive terminal grounded while its negative terminal is connected to collector 17 through a suitable impedance such as a resistor 23. It will, of course, be understood that instead of grounding base electrode 14 either emitter 18 or collector 17 may be grounded, as is well known.

The potentials applied to the electrodes 14, 17 and 18 will develop an electric field within crystal 10. The equipotential lines of the developed field are indicated at 25. The holes which are injected by emitter 18 into crystal 10 follow paths indicated at 26. These paths, of course, are obtained by intersecting the equipotential lines at right angles. The electrons injected by collector 17 into crystal 10 follow the paths indicated at 27.

It will accordingly be seen that the holes or positive charge carriers which are injected into the crystal 10 by emitter 18 are substantially focused upon the collector 17. Of course a few of the holes will be lost by recombination, while a few other holes will be collected by the base 14. On the other hand, the electrons or negative charge carriers injected into the crystal 10 by the collector 17 are substantially defocused as shown by their paths 27. Consequently, the majority of the electrons is collected by the base 14. Here again a few of the electrons are lost by recombination with the holes while a small percentage of the electrons is collected by the emitter 18.

Consequently, the collector impedance is reduced and the ratio of the collector impedance to the emitter impedance is made smaller. As has been pointed out hereinbefore, this will facilitate matching of cascade connected transistor amplifier stages. In view of the fact that very few of the holes injected into the body 10 by emitter 18 are lost, the efficiency of the transistor is increased and the required emitter current is reduced. It has also been found that the gain of the transistor as illustrated in Figure 1 is improved.

It will, of course, be understood that if emitter 18 and collector 17 are exchanged, the holes injected by the emitter into the crystal will no longer be focused, but will be collected substantially completely by the base electrode.

A preferred embodiment of the transistor of the invention is illustrated in Figure 2. The transistor is enclosed by a metallic housing 30 which may be of cylindrical shape. It has a wide opening 31 at one end and a communicating smaller opening 32 at the other end to provide a shoulder 33. The transistor again consists of a crystal or body 10 to which is soldered a sheet or foil 14 having a central aperture. The foil 14 may, for example, consist of copper having a thickness of approximately 2 mils and a central aperture of 10 mils or less. The crystal 10 is then ground or lapped to a thickness of between approximately 10 to 3 mils. Thereupon the crystal is etched in the conventional manner. The wires 17 and 18 which form the collector and emitter respectively may consist of Phosphor bronze wires which may have a thickness of 5 to 10 mils and which may be electrolytically pointed or otherwise provided with pointed ends.

Wire 17 is mechanically and electrically connected to a support wire 34 and wire 18 is similarly connected to support wire 35. The support wires 34 and 35 extend through insulating cylinder 36 and 37 respectively which have such a diameter that they have a press fit with openings 31 and 32 respectively. A pair of guide members 38 and 40 is provided which fit into opening 31 and which are provided with central apertures which may have a diameter of 6 mils. These apertures should be wide enough so that the wires 17, 18 may extend therethrough and are located thereby. Guide member 38 rests against shoulder 33. A metallic spacer ring 41 is in contact with guide member 38, and foil 14 is pressed against spacer ring 41 by the second guide member 40. Accordingly, foil 14 is in electrical contact with metallic spacer ring 41 and housing 30, and a terminal wire 42 may be connected to the housing 30. The transistor of Figure 2 may be energized as shown in Figure 1.

The transistor shown in Figure 2 may be assembled by inserting in succession guide member 38, spacer ring 41, crystal 10 with its foil 14 and guide member 40 into opening 31 of housing 30. Thereafter the insulating cylinders 36 and 37 are inserted into opposite ends of the housing until the wires 17 and 18 are in contact with the crystal 10. It has been found that the construction illustrated in Figure 2 provides for high heat dissipation in view of the small size of the crystal and the large area of the base electrode 14.

It will be understood that instead of providing a collector 17 and emitter 18 which are in point contact with the crystal 10 it is also feasible to provide electrodes in line contact with the crystal as disclosed and claimed in applicant's copending application filed on March 31, 1949, Serial No. 84,672 entitled "Semi-Conductor Devices" and issued on February 7, 1956, as U. S. 2,734,102.

There has thus been disclosed an improved transistor device having electrodes of such a configuration that the charge carriers injected into the crystal by the emitter are substantially focused onto the collector. The charge carriers injected into the crystal by the collector are defocused so that they are collected preponderantly by the base. The thus resulting transistor device has an improved gain and efficiency, a reduced required emitter current and a smaller ratio of output impedance to input impedance.

What is claimed is:

1. A semi-conductor device comprising a semi-conducting body, said body having a first substantially plane surface and a second surface disposed opposite said first surface, an emitter electrode in rectifying contact with said second surface, a collector electrode in rectifying contact with said first surface, and a base electrode in low-resistance contact with substantially the entire area of said first surface with the exception of a predetermined small surface portion located about the contact area of said collector electrode with said first surface, means for applying a voltage in the forward direction between said emitter and base electrodes and a voltage in the reverse direction between said collector and base electrodes whereby the charge carriers injected into said body by said emitter electrode are substantially focused upon said collector electrode while the charge carriers injected into said body by said collector electrode are defocused so that the majority thereof is collected by said base electrode.

2. A semi-conductor device comprising a semi-conducting body having a first substantially plane surface and a second surface disposed opposite said first surface, an emitter electrode consisting of a fine conductor in contact with said second surface, a collector electrode consisting of a fine conductor in contact with said first surface, a base electrode consisting of a metallic member in low-resistance contact with substantially the entire area of said first surface with the exception of a predetermined small surface portion located about the contact area of said collector electrode with said body, and circuit means for applying a voltage in the forward direction between said emitter and base electrodes and applying a voltage in the reverse direction between said collector and base electrodes, thereby to focus the charge carriers injected into said body by said emitter electrode onto said collector electrode and to defocus the charge carriers injected into said body by said collector electrode so that they are collected preponderantly by said base electrode.

3. A semi-conductor device comprising a semi-conducting body having a first and a second substantially plane surface, said surfaces being disposed substantially parallel to each other, an emitter electrode consisting of a fine pointed conductor in contact with said second surface, a collector electrode consisting of a fine pointed conductor in contact with said first surface, a base electrode consisting of a metallic member in low-resistance contact with substantially the entire area of said first surface with the exception of a predetermined small surface portion located about the contact area of said collector electrode with said body, and means for applying a voltage in the forward direction between said emitter and base electrodes and applying a voltage in the reverse direction between said collector and base electrodes, thereby to focus the charge carriers injected into said body by said emitter electrode onto said collector electrode and to defocus the charge carriers injected into said body by said collector electrode so that they are collected preponderantly by said base electrode.

4. A semi-conductor device comprising a semi-conducting body having a first and a second substantially plane surface, said surfaces being disposed substantially parallel to each other, an emitter electrode consisting of a fine pointed wire having its point in contact with said second surface, a collector electrode consisting of a fine pointed wire having its point in contact with said first surface opposite said emitter electrode, a base electrode consisting of a metallic foil in low-resistance contact with substantially the entire area of said first surface with the exception of a predetermined small surface portion located about the contact area of said collector electrode with said body, and means for applying a voltage in the forward direction between said emitter and base electrodes and applying a voltage in the reverse direction between said collector and base electrodes, thereby to focus the charge carriers injected into said body by said emitter electrode onto said collector electrode and to defocus the charge carriers injected into said body by said collector electrode so that they are collected preponderantly by said base electrode.

5. A semi-conductor device comprising a semi-conducting body having a first and a second substantially plane surface, said surfaces being disposed substantially parallel to each other, a metallic foil soldered to said first surface and having a central aperture, a metallic housing having an opening extending therethrough and providing a shoulder therein, a first and a second guide member, each being of insulating material and having a central aperture therein, said first guide member being disposed in said opening against said shoulder, a metallic spacer ring disposed in said opening and resting against said first guide member, said body and foil being disposed in said opening and said foil being in electric contact with said ring and with said housing, said second guide member resting against said foil, a first and a second pointed wire, means for supporting said first wire in said opening with its pointed end in contact with said second surface and extending through the central aperture in said first guide member, and means for supporting said second wire in said opening with its pointed end in contact with said first surface and disposed within the central aperture of said foil, said second wire extending through the central aperture of said second guide member, said foil being adapted for use as a base electrode, said first and second wires being adapted respectively for use as emitter and collector electrodes.

6. A semi-conductor device comprising a semi-conducting body having a first and a second substantially plane surface, said surfaces being disposed substantially parallel to each other, a metallic foil soldered to said first surface and having a central aperture, a metallic housing having an opening extending therethrough and providing a shoulder therein, a first and a second guide member, each being of an insulating material and having a central aperture therein, said first guide member being disposed in said opening against said shoulder, a metallic spacer ring disposed in said opening and resting against said first guide member, said body and foil being disposed in said opening and said foil being in electric contact with said ring and said housing, said second guide member resting against said foil, a first and a second pointed wire, means for supporting said first wire in said opening with its pointed end in contact with said second surface and extending through the central aperture in said first guide member, and means for supporting said second wire in said opening with its pointed end in contact with said first surface and disposed within a central aperture of said foil opposite the contact area of said first wire with said second surface, said second wire extending through the central aperture of said second guide member, and means for applying a voltage in the forward direction between said first wire and said housing and for applying a voltage in the reverse direction between said second wire and said housing.

7. A semiconductor device comprising a body of semiconductor material having a pair of opposed surfaces, an emitter electrode in rectifying contact with one of said surfaces, a collector electrode in rectifying contact with the other of said surfaces, and a ring-shaped base electrode on said other surface in non-rectifying contact with said body and closely surrounding said collector electrode, means for applying a voltage in the forward direction between said emitter and base electrodes, and for applying a voltage in the reverse direction between said collector and base electrodes.

References Cited in the file of this patent

UNITED STATES PATENTS

| | | |
|---|---|---|
| 2,524,033 | Bardeen | Oct. 3, 1950 |
| 2,549,550 | Wallace | Apr. 17, 1951 |
| 2,553,491 | Shockley | May 15, 1951 |
| 2,560,579 | Kock et al. | July 17, 1951 |
| 2,563,503 | Wallace | Aug. 7, 1951 |
| 2,563,504 | Pfann | Aug. 7, 1951 |
| 2,623,103 | Kircher | Dec. 23, 1952 |

OTHER REFERENCES

Kinman, Abstract, Ser. No. 65,305, published Dec. 18, 1951.